United States Patent [19]

Sugiyama et al.

[11] Patent Number: 4,680,724

[45] Date of Patent: * Jul. 14, 1987

[54] SHEET-LIKE MINIATURIZED ELECTRONIC DEVICE

[75] Inventors: Kazuhiro Sugiyama; Tatsuo Shimazaki, both of Tokyo, Japan

[73] Assignee: Casio Computer Co., Ltd., Tokyo, Japan

[*] Notice: The portion of the term of this patent subsequent to Dec. 10, 2002 has been disclaimed.

[21] Appl. No.: 825,953

[22] Filed: Feb. 4, 1986

Related U.S. Application Data

[63] Continuation of Ser. No. 490,581, May 2, 1983, abandoned.

[30] Foreign Application Priority Data

Dec. 3, 1982 [JP] Japan .................. 57-212150

[51] Int. Cl.⁴ ............................. G06F 15/02
[52] U.S. Cl. .................................... 364/708
[58] Field of Search ............... 364/708, 712; 235/380, 235/488

[56] References Cited

U.S. PATENT DOCUMENTS

| | | | |
|---|---|---|---|
| 4,044,231 | 8/1977 | Beck et al. | 235/488 |
| 4,096,577 | 6/1978 | Ferber et al. | 364/709 |
| 4,158,230 | 6/1979 | Washizuka et al. | 364/709 |
| 4,209,735 | 6/1980 | Yoshida | 364/708 |
| 4,222,516 | 9/1980 | Badet et al. | 235/492 |
| 4,224,675 | 9/1980 | Pinkerman | 364/705 |
| 4,261,042 | 4/1981 | Ishiwatari et al. | 364/709 |
| 4,263,659 | 4/1981 | Hirata et al. | 364/709 |
| 4,293,754 | 10/1981 | Komaki | 200/340 |
| 4,298,793 | 11/1982 | Melis et al. | 235/488 |
| 4,336,530 | 6/1982 | Koike et al. | 340/712 |
| 4,338,502 | 7/1982 | Hashimoto et al. | 200/159 |
| 4,404,643 | 9/1983 | Ojima et al. | 364/708 |
| 4,417,413 | 11/1983 | Hoppe et al. | 235/488 |
| 4,423,294 | 12/1983 | Walser et al. | 200/159 B |
| 4,463,971 | 8/1984 | Hoppe et al. | 235/488 |
| 4,529,870 | 7/1985 | Chaum | 235/380 |

FOREIGN PATENT DOCUMENTS

| | | | |
|---|---|---|---|
| 3307356 | 9/1983 | Fed. Rep. of Germany | |
| 1491822 | 11/1977 | United Kingdom | 364/708 |
| 2116777 | 9/1983 | United Kingdom | |

Primary Examiner—Archie E. Williams, Jr.
Assistant Examiner—Dale M. Shaw
Attorney, Agent, or Firm—Frishauf, Holtz, Goodman & Woodward

[57] ABSTRACT

A sheet-like miniaturized electronic device includes an electronic component assembly with a wiring base having switch contacts and a semiconductor IC chip operated by signals from the switch contacts. A display panel displays data according to signals from the semiconductor IC chip, and a battery supplies a drive voltage to the semiconductor IC chip. The wiring base, display panel and battery are electrically connected to one another and arranged in the same plane. An upper cover is provided in close contact with the upper side of the electronic component assembly, and has an operating section and a transparent display window. A lower cover is provided through an adhesive layer to the underside of the electronic component assembly.

16 Claims, 15 Drawing Figures

F I G. 2(A)
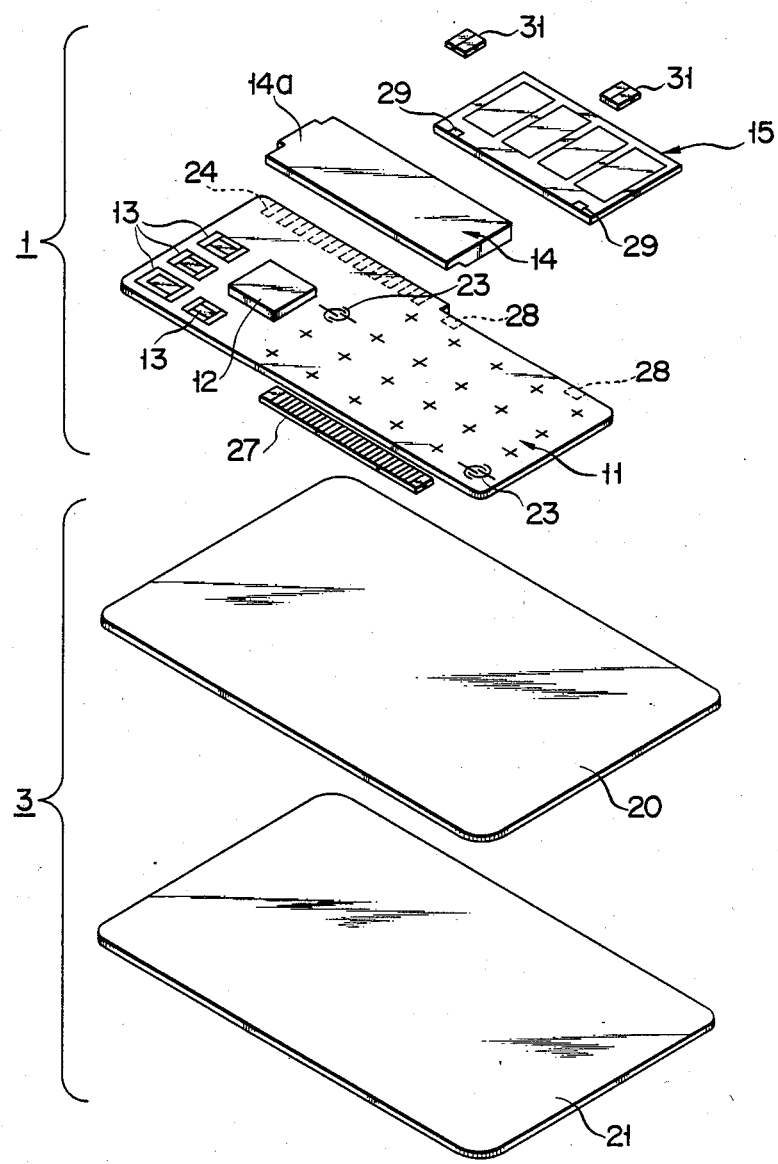

SHEET-LIKE MINIATURIZED ELECTRONIC DEVICE

This application is a continuation of application Ser. No. 490,581, filed May 2, 1983, now abandoned.

BACKGROUND OF THE INVENTION

This invention relates to a miniaturized electronic device having a thin sheet-like shape.

Recently, the thickness of miniaturized electronic devices, such as miniaturized electronic calculators and timepieces, has been greatly reduced. However, there is a demand for even thinner, sheet-like portable electronic devices which would be no thicker than a credit card.

In the prior art miniaturized electronic calculators, however, various components such as certain electronic parts, a wiring base, a display panel and a battery are accommodated in a casing. This imposes a lower limit on the height (i.e., the thickness) of the device, and so it has been impossible to obtain a sheet-like device as thin as a credit card.

SUMMARY OF THE INVENTION

The present invention has been created in light of the above situation, and its object is to provide a thin, sheet-like miniaturized electronic device, which has a uniform height or thickness dimension and is extremely flat.

To attain the above object, according to the invention there is provided a sheet-like miniaturized electronic device, which comprises an electronic component assembly including a wiring base having switch contacts and a semiconductor IC chip operated by signals from the switch contacts, a display panel for displaying data according to signals from the semiconductor IC chip, and a battery for supplying a drive voltage to the semiconductor chip, the wiring base, display panel and battery being electrically connected to one another and disposed in the same plane; and an upper cover provided in close contact with the upper side of the electronic component assembly and having an externally operated operating section to supply signals to the switch contacts, a transparent display window provided in a position corresponding to the display panel; an adhesive layer consisting of an adhesive applied to the underside of the electronic component assembly; and a lower cover provided in close contact with the underside of the adhesive layer.

The sheet-like miniaturized electronic device having the above construction according to the invention is assembled by laminating the upper cover on the upper side of the electronic component assembly in close contact therewith, applying the adhesive layer to the underside of the electronic component assembly and laminating the lower cover on the underside of the adhesive layer in close contact therewith. The adhesive layer can thus accomodate fluctuations of the thickness of the electronic component assembly and improve the flatness of the thin sheet-like miniaturized electronic device.

BRIEF DESCRIPTION OF THE DRAWING

FIGS. 2(A) and 2(B) are exploded perspective views showing the sheet-like miniaturized electronic calculator shown in FIG. 1;

DETAILED DESCRIPTION OF THE PREFERRED EMBODIMENTS

Figure 1:
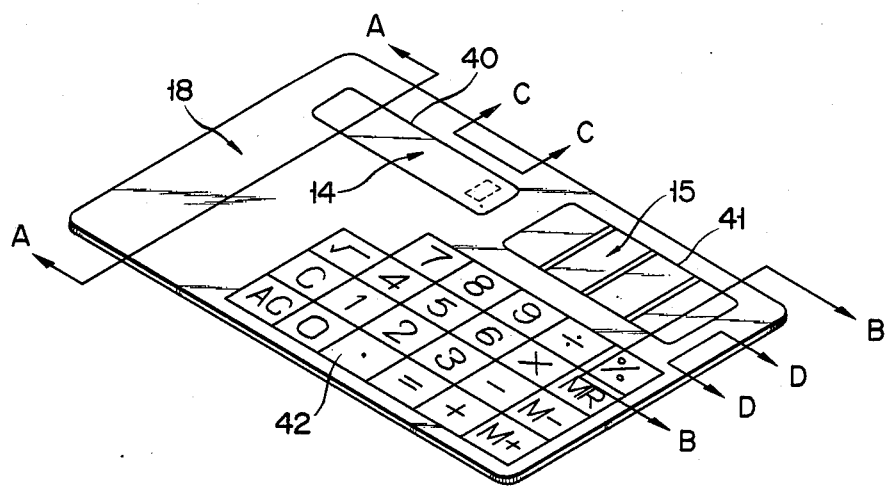
Fig. 1 is a perspective view showing a sheet-like miniaturized electronic calculator embodying the invention.

FIG. 1 is a perspective view of a sheet-like miniaturized electronic calculator, and FIGS. 2(A) and (B) are exploded perspective views of the same. The electronic calculator comprises an electronic component assembly 1, an upper cover 2 and a lower cover 3. The electronic component assembly 1 includes a wiring base 11, a semiconductor IC chip 12, electronic components 13, a display panel 14 and a solar battery 15. The upper cover 2 includes an upper protective sheet 18, a switch contact sheet 16, a spacer 17 and a frame 19, these parts being laminated together. The lower cover 3 includes a support sheet 20 and a lower protective sheet 21, these parts being laminated together. The electronic calculator further comprises an adhesive layer consisting of an insulating adhesive 22, which is shown in FIGS. 3 through 6. The upper cover 2 is laminated on the upper side of the electronic component assembly 1 in close contact therewith, an adhesive layer 4 is provided on the underside of the electronic component assembly 1, and the lower cover 3 is laminated on the underside of the adhesive layer 4 in close contact therewith. The entire structure thus has a form just like a thin sheet.

Figure 3:
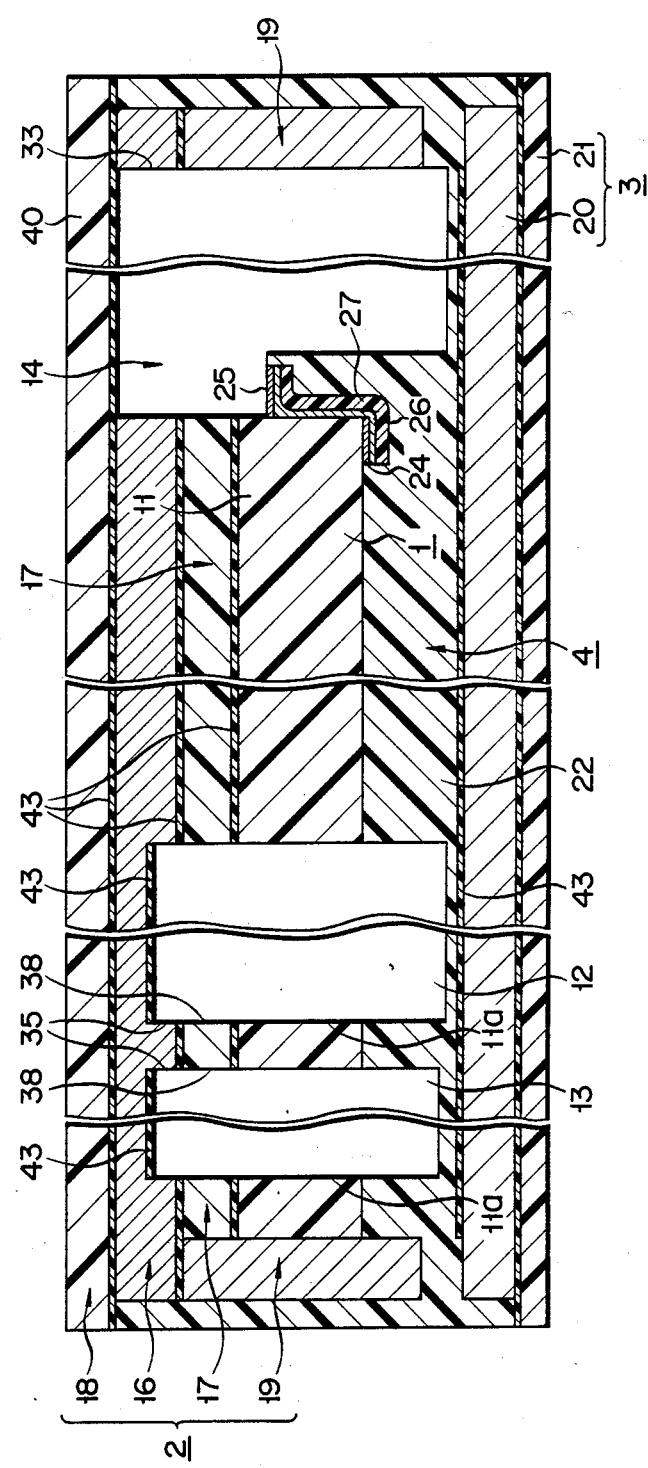
FIG. 3 is an enlarged fragmentary sectional view, taken along line A—A in FIG. 1.

The construction of the individual parts will now be described with reference to FIGS. 3 through 8. FIG. 3 is a fragmentary sectional view, partly broken away, taken along line A—A in FIG. 1.

Figure 4:
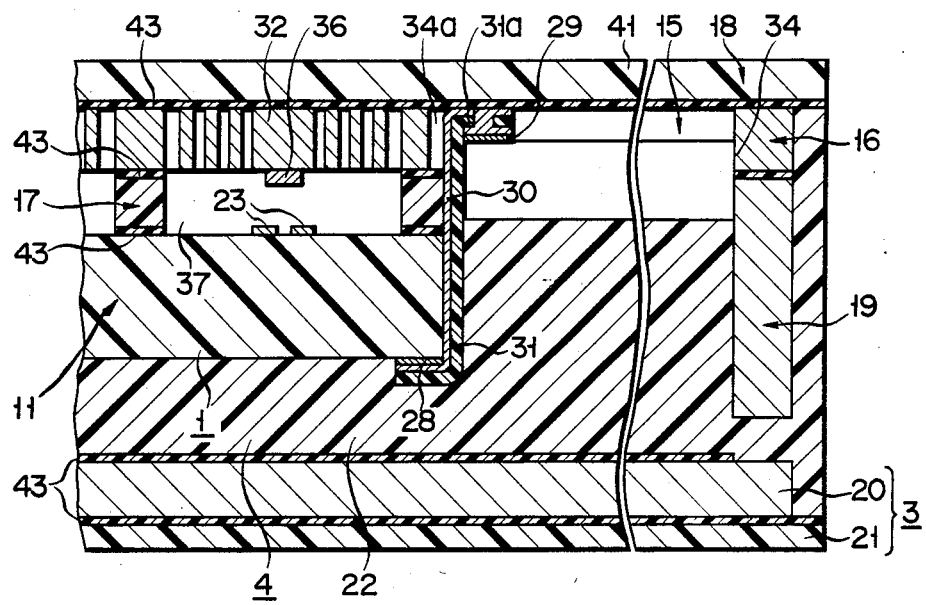
FIG. 4 is an enlarged fragmentary sectional view, taken along line B—B in FIG. 1.

First, the electronic component assembly 1 will be described. The wiring base 11 is a rectangular sheet of an insulating material approximately 220 $\mu$ thick (microns = $10^{-6}$ m.) It has a plurality of fixed switch contact pairs 23 formed on its upper side in a lattice-like array. It also has wiring patterns including the fixed switch contact pairs 23, as well as terminals 24 and 28 to be described later. These lead patterns are formed on the upper and lower sides of the wiring base 11. The wiring base 11 further has see-through mounting holes 11a. The semiconductor IC chip 12 and electronic components 13 such as chip capacitors and diodes are mounted in the mounting holes 11a such that they penetrate these holes. They are connected to the lead patterns formed on the wiring base 11. The display panel 14 is a liquid crystal display panel consisting of a liquid crystal packed in a film package. Its thickness is approximately 550 μ. The liquid crstal is sealed between upper and lower films, which respectively serve as upper and lower electrode bases and have film ends 14a (FIG. 2A). The display panel 14 is disposed parallel to the wiring base 11 and in the base plane as the same. As shown in FIG. 3, the terminals 24 of the wiring base 11, formed on the underside thereof, are each connected to each terminal 25 formed on the underside of the upper electrode base of the display panel 14 through a flexible film 27 having a lead 26 consisting of a conductive adhesive. The terminals 24, 25 and leads 26 are bonded together by applying heat and pressure. The solar battery 15 (FIG. 4) has a stainless steel base and a thin film of amorphous silicon formed on the base, and is approximately 180 μ in thickness. It is disposed parallel to the wiring base 11 and in the base plane as the same. As shown in FIG. 4, the terminal 28 of the wiring base 11, formed on the underside thereof, is connected to terminal 29 formed on the upper side of the base of the solar battery 15 through a flexible film 31 having a lead 30 consisting of a conductive adhesive. The terminals 28 and 29 and lead 30 are bonded together by applying heat and pressure. The flexible film 31 is provided against the wiring base 11 such that it prevents the short-circuit of the lead 30 to the base of the solar battery 15. The lead 30 is led through a see-through hole 31a and electrically connected to the corresponding terminal 29 on the base of the solar battery 15. The components of the electronic component assembly 1 are arranged in a planar arrangement and electrically connected together. The semiconductor IC chip 12 effects processing with signals supplied from the fixed switch contacts 23 using power furnished from the solar battery 15 to produce signals representing the results of processing for display on the display panel 14.

Figure 2B:
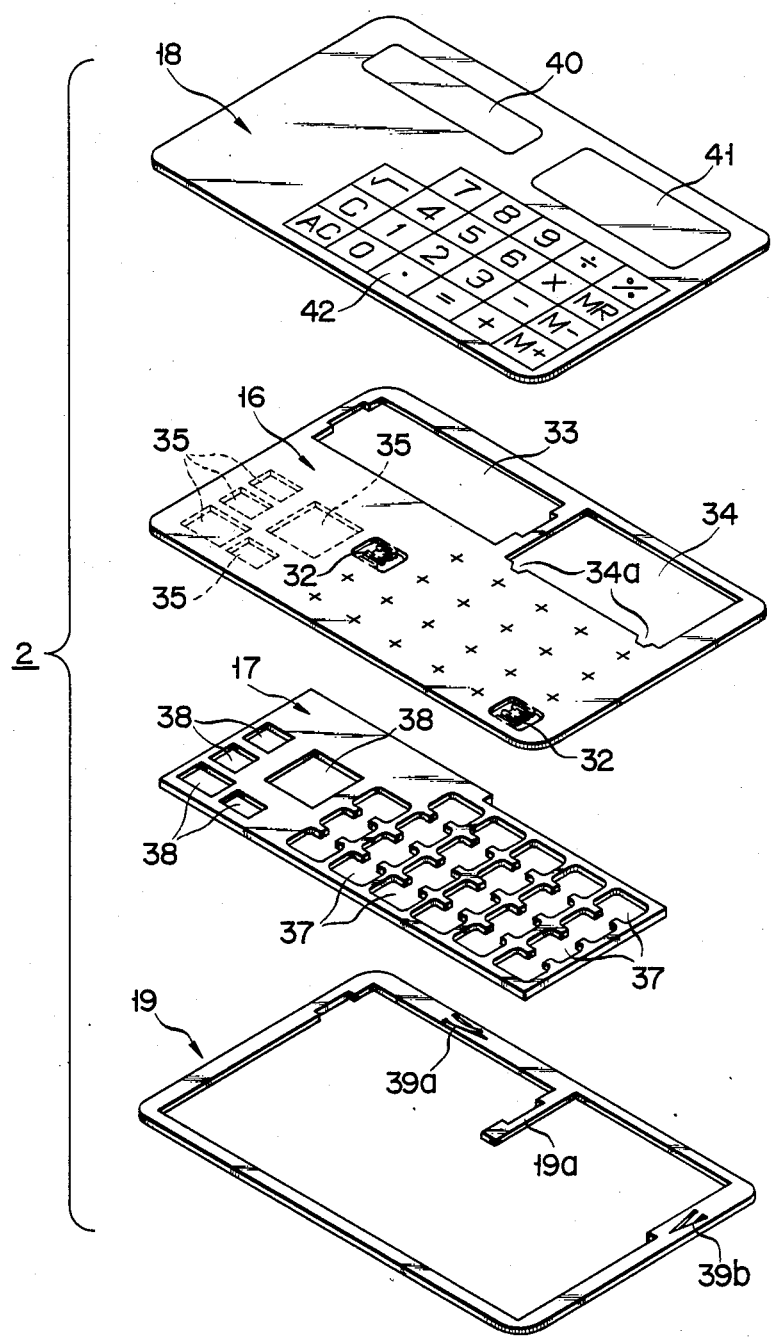
Figure 5:
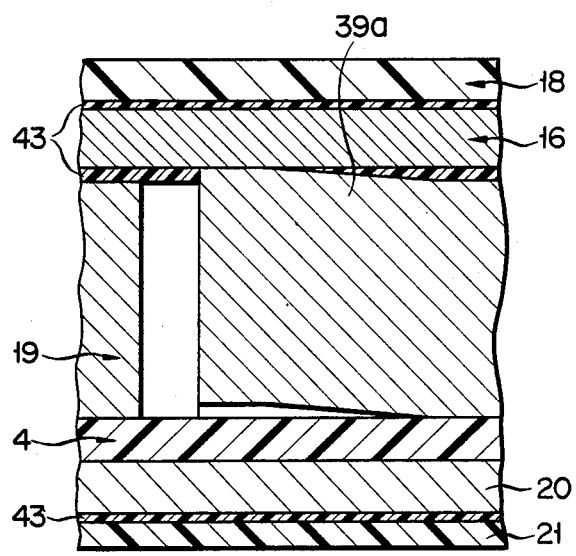
FIG. 5 is an enlarged fragmentary sectional view, taken along line C—C in FIG. 1.
Figure 6:
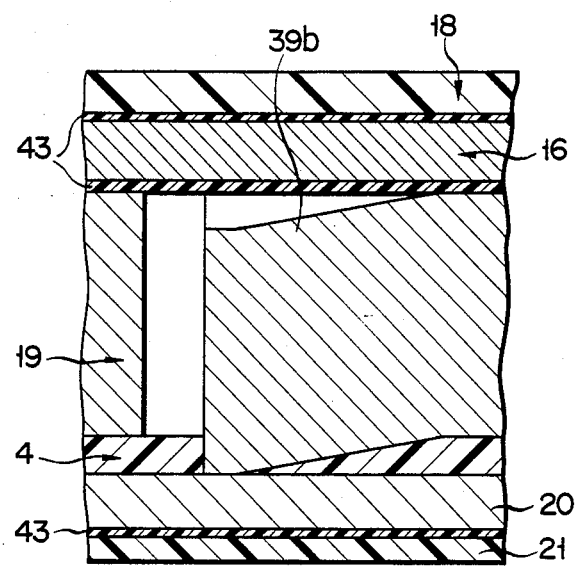
FIG. 6 is an enlarged fragmentary sectional view, taken along line D—D in FIG. 1.
Figure 7:
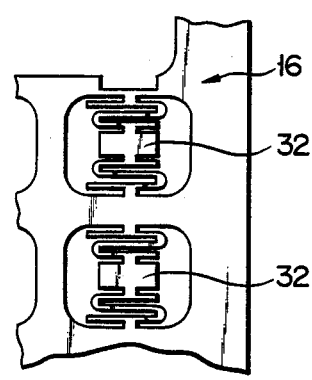
FIG. 7 is a fragmentary plan view showing switch springs of a switch contact sheet.
Figure 8:
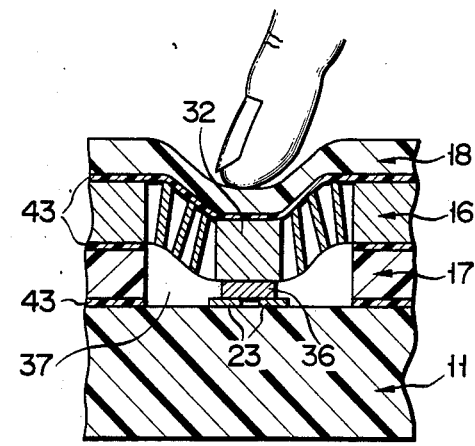
FIG. 8 is a fragmentary sectional view showing a switch being operated.

The upper cover 2 will now be described. The switch contact sheet 16 is a stainless steel sheet approximately 100 μ in thickness. It is rectangular in shape and corresponds in size to the frame 19. It has a plurality of switch contact springs 32, as shown in FIG. 7. These switch contact springs 32 are formed through an etching treatment. They are arranged in a lattice-like array and individually correspond to the respective fixed contact pairs 23 on the wiring base 11. The switch contact sheet 16 also has a display window 33 and a battery window 34, these windows also being formed through an etching treatment in positions corresponding to the display panel 14 and solar battery 15, respectively. It further has recesses 35 (FIG. 2B) formed through an etching treatment on its underside in positions corresponding to the semiconductor IC chip 12 and electronic components 13. Each of the switch contact springs 32 has a movable contact 36 which can co-operate with a corresponding pair of the fixed contacts 23 for coupling signals. The movable contact 36 is formed by coating a carbon paint on a central portion of the underside of the switch contact spring 32. The battery window 34 formed in the switch contact sheet 16 includes lead hole portions 34a, through which the leads of the flexible films 31 are led (FIG. 4). The spacer 17 is a transparent polyester film approximately 50 μ in thickness, which serves to hold the switch contact sheet 16 and wiring base 11 apart. It is rectangular in shape and corresponds in size to the wirin base 11. It has switch contact holes 37 formed in a lattice-like arrangement such that they individually correspond in position to the respective fixed switch contacts 23 on the wiring base 11. It further has openings 38 formed in positions corresponding to the semiconductor IC chip 12 and electronic components 13, and is provided on each side thereof with a coating of a transparent insulating adhesive 43 with a thickness of approximately 25 μ. The frame 19 is formed from a stainless steel sheet approximately 400 μ thick. It is a rectangular frame surrounding the electronic component assembly 11 and having a partitioning projection 19a, by which the display panel 14 and solar battery 15 are spaced apart (FIG. 2B). It further has contacts 39a and 39b provided at suitable positions. As shown in FIGS. 5 and 6, the contacts 39a and 39b are formed by cutting corresponding portions of the frame 19 and bending these portions upward and downward, respectively. The upper protective sheet 18 serves to protect the upper side of the switch contact sheet 16. It is made from a transparent polyester film approximately 50 μ thick. It is rectangular in shape and slightly larger than the switch contact sheet 16. Its underside is provided with a non-transparent paint except for a see-through area 40 corresponding to the display panel 14 and a light-receiving area 41 corresponding to the solar battery 15. Its top is provided with an impression 42 of symbols for the respective switches. These symbols are provided in positions corresponding to the respective switch contact springs 32 of the switch contact sheet 16 (FIG. 2B). The underside of the upper protective sheet 18 is provided with a coating of the transparent insulation adhesive 43 to a thickness of approximately 25 μ. The spacer 17 is disposed over the wiring base 11 of the electronic component assembly 1 and bonded thereto by the insulating adhesive 43 coated on its underside. The switch contact sheet 16 is disposed over the spacer 17 and bonded to the same by the insulating adhesive coated on its upper side. The upper protective sheet 18 is disposed over the switch contact sheet 16 and bonded to the same by the transparent insulating adhesive 43 coated on its underside. The frame 19 is disposed beneath the switch contact sheet 16 such that it surrounds the electronic component assembly 1 and spacer 17, and is bonded to the underside of the switch contact sheet 16 by the adhesive 43 coated on the underside thereof. As shown in FIG. 4, the switch contact springs 32 of the switch contact sheet 16 and corresponding switch holes 37 of the spacer 17 overlap. The movable contacts 36 on the switch contact springs 32 are found over the corresponding fixed contacts 23 of the wiring base 11 via the respective switch holes 37. The symbols of the impression 42 on the upper protective sheet 18 are found over the corresponding switch contact springs 32. Each switch contact spring 32 of the switch contact sheet 16 is normally held in its horizontal state by its own spring force as shown in FIG. 4, with the movable contact 36 and fixed contact 23 being spaced apart. When a portion of the impression 42 on the upper protective sheet 18 corresponding to a given switch contact spring 32 of the switch contact sheet 16, is pushed down with a finger, as shown in FIG. 8, the switch contact spring 32 is flexed downward against its spring force into the switch hole 37 in the spacer 17, whereby the movable contact 36 is brought into contact with the fixed contact pair 11.

As shown in FIG. 3, the see-through area 40 of the upper protective sheet 18 and the display window 33 of the switch contact sheet 16 overlap. An upper portion of the display panel 14 is situated in the display window 33, and its display surface faces the transparent see-through area 40. The display on the display panel 14 can thus be read out through the see-through area 40. The top of the display panel 14 is bonded to the upper protective sheet 18 by the transparent insulating adhesive 43.

As shown in FIG. 4, the light-receiving area 41 of the upper protective sheet 18 and the battery window 34 of the switch contact sheet 16 overlap. The solar battery 15 is set in the battery window 34, and its light-receiving element faces the transparent light-receiving area 41. The solar battery 15 can thus receive external light through the light-receiving area 41. Its top is bonded to the upper protective sheet 18 by the transparent insulating adhesive 43.

FIG. 3 shows the recesses 35 in the switch contact sheet 16 and openings 38 in the spacer 17. The upper portions of the semiconductor IC chip 12 and electronic components 13 mounted in the wiring base 11 are set in the recesses 35 and openings 38, respectively. Meanwhile, they are insulated from the switch contact sheet 16 by the insulating adhesive 43. The upper cover 2 is thus laminated over the upper surface of the electronic component assembly 1 in close contact therewith. In the present embodiment, the frame 19 is provided as part of the upper cover 2, and it surrounds and holds the electronic component assembly 1.

The adhesive layer 4 will now be described. Its insulating adhesive 22 consists of acrylic resin or an epoxy resin-based insulating adhesive of mixed two-liquid type. The insulating adhesive 22 is provided to fill a space defined between the protective sheet 18 of the upper cover 2 and the protective sheet 21 of the lower cover 3. Thus, it entirely covers the underside of the wiring base 11 of the electronic component assembly 1 and also the underside of the semiconductor IC chip 12 and electronic components 13 projecting from the underside of the wiring base 11. Further, it covers the underside of the display panel 14 and solar battery 15. Furthermore, it surrounds the outer side surfaces of the frame 19 in the upper cover 2. The individual components of the electronic component assembly 1 thus have their underside secured in position by the insulating adhesive 22. In addition, the irregularities of the height of the components projecting from the underside of the wiring base 11 of the electronic component assembly 1, are made up for by the insulating adhesive 22. Where a case structure is used in lieu of the adhesive layer 4 on the underside of the electronic component assembly 1, a complicated structure will be necessary for securing the electronic component assembly 1 in position. Also, in this case, it is difficult to compensate for the irregularities of the height of the individual components. In particular, it is difficult to make up for errors, if any, in the mounting dimensions or thickness of the components of the electronic component assembly 1. The adhesive layer 4 in the present embodiment, in contrast, has fluidity, so that it can reliably secure the components of the electronic component assembly 1 in correct positions while taking up the irregularities of the component's thickness dimension. In particular, it is possible to absorb errors that may be introduced in the mounting dimensions or thickness of the components at the time of assembly. Further, since the insulating adhesive 22 secures the outer side surfaces of the frame 19 positioned between the protective sheets 18 and 21, the mechanical strength of the sheet-like miniaturized electronic calculator can be increased. Moreover, the junctions between adjacent laminated parts on the sides of the calculator can be covered by the adhesive 22 to obtain an improved appearance.

The lower cover 3 will now be described. The support sheet 20, as shown in FIGS. 4 and 5, is made from a stainless steel sheet approximately 100 $\mu$ thick. It is rectangular in shape and the same size as the frame 19 of the upper cover 2. The lower protective sheet 21 is made from a transparent polyester film approximately 25 $\mu$ thick. It is rectangular in shape and is slightly greater in size than the support sheet 20. A transparent insulating adhesive 43 is coated on its upper side to a thickness of approximately 25 $\mu$. The support sheet 20 is secured to the underside of the adhesive layer 4. It is provided on its upper side and at portions thereof facing the components of the electronic component assembly 1 with an insulating adhesive 43 so that it is insulated from the components. The lower protective sheet 21 is secured to the underside of the support sheet 20 via the adhesive 43. The lower cover 3 can be disposed parallel to the upper cover 2 and, if necessary, precisely spaced apart therefrom, because the adhesive 22, to which the support sheet 20 is secured, has fluidity. In addition, its distance 2 from the upper cover 2, i.e., the thickness of the calculator, can be adjusted during manufacture. The support sheet 20 supports the adhesive layer 4 from the underside thereof. The lower protective sheet 21 protects the underside of the support sheet 20. Its underside, i.e., its outer side, may be provided with a decorative impression.

In the sheet-like miniaturized electronic calculator as described above, the switch contact sheet 16, frame 19 and support sheet 20 are made from metal sheets such as stainless steel sheets. Thus, the calculator has high mechanical strength and is very rugged. The thickness of this calculator is approximately 800 $\mu$.

The sheet-like miniaturized electronic calculator as described above is further provided with electrostatic shielding means. To be more specific, the upwardly bent contact 39a of the frame 19, as shown in FIG. 5, is in contact with the underside of the switch contact sheet 16, while the downwardly bent contact 39b, as shown in FIG. 6, is in contact with the upper side of the support sheet 20. With this arrangement, the switch contact sheet 16, made of a stainless steel sheet which is disposed over the stainless steel frame 19, and the support sheet 20, also made from a stainless steel sheet which is disposed beneath the frame 19, can be held at the same electric potential as the frame 19. Thus, it is possible to eliminate the effects of external static electricity on the semiconductor IC chip 12 mounted in the wiring base 11, etc.

Figure 9:
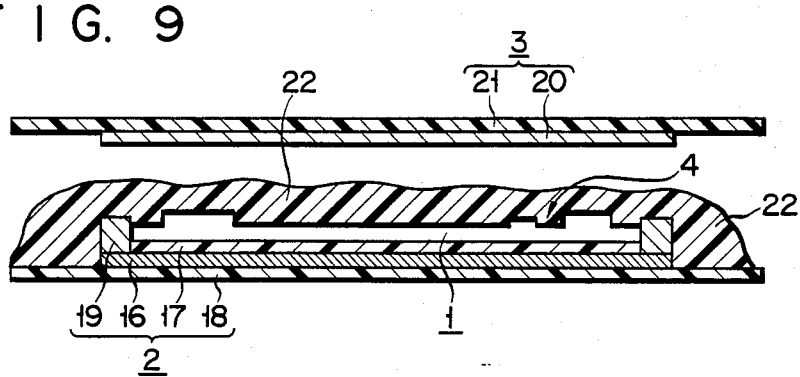
FIGS. 9 and 10 are views for explaining the process of assembling the sheet-like miniaturized electronic device according to the invention.
Figure 10:
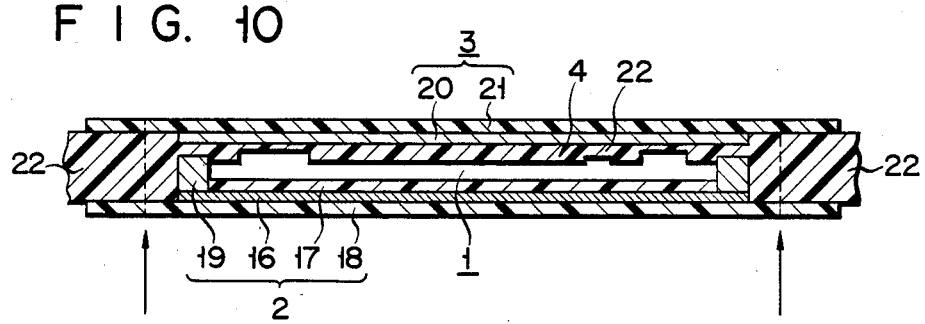

Now, the method of manufacture of the sheet-like miniaturized electronic calculator having the above construction will be described. The electronic component assembly 1, as is seen from FIG. 2A, is assembled by mounting the semiconductor IC chip 12 and electronic components 13 in the wiring base 11 with the surface (upper surface) thereof as a reference surface, and then connecting the display panel 14 and solar battery 15 to the wiring base 11 with the flexible films 27 and 31. The upper cover 2 is assembled by securing the frame 19 to the underside of the switch contact sheet 16 via the adhesive 43 by the application of heat and pressure, and then securing the upper protective sheet 18 to the upper side of the switch contact sheet 16 via the adhesive 43, again by the application of heat and pressure. The electronic component assembly 1 and the lamination of the frame 19 and switch contact sheet 16 are then set on the upper and lower sides of the spacer 17, respectively, and the three are secured together, via the adhesive 43 provided on both sides of the spacer 17, by the application of heat and pressure. At this time, the surface of the upper protective sheet 18 is made a reference surface. When the three parts noted above have been secured, a semi-assembly consisting of the upper cover 2 and electronic component assembly 1 is obtained. This semi-assembly is flat on the side of the upper cover 2 and has a complicated configuration on the side of the electronic component assembly 1 in which the components project (see FIGS. 9 and 10). The semi-assembly is then held inverted, i.e., with the side of the upper cover 2 directed downwards and the side of the electronic component assembly 1 directed upwards. Then, the top and four sides, i.e., the periphery, of the inverted semi-assembly is covered with the adhesive 22. The adhesive 22 at this time has fluidity, so that it can readily fill the spaces defined by the complicated configuration of the projecting components of the electronic component assembly 1 and cover all these components. The adhesive layer 4 formed in this way thus accommodates the irregularities of the height or thickness of the individual components of the electronic component assembly 1. Meanwhile, the lower cover 3 is prepared by securing together the support sheet 20 and lower protective sheet 21 via the adhesive 43 by the application of heat and pressure. The lower cover 3 thus prepared is placed on the adhesive 22 provided on the semi-assembly noted above, and it is then secured to the adhesive 22 by the application of pressure.

Figure 11:
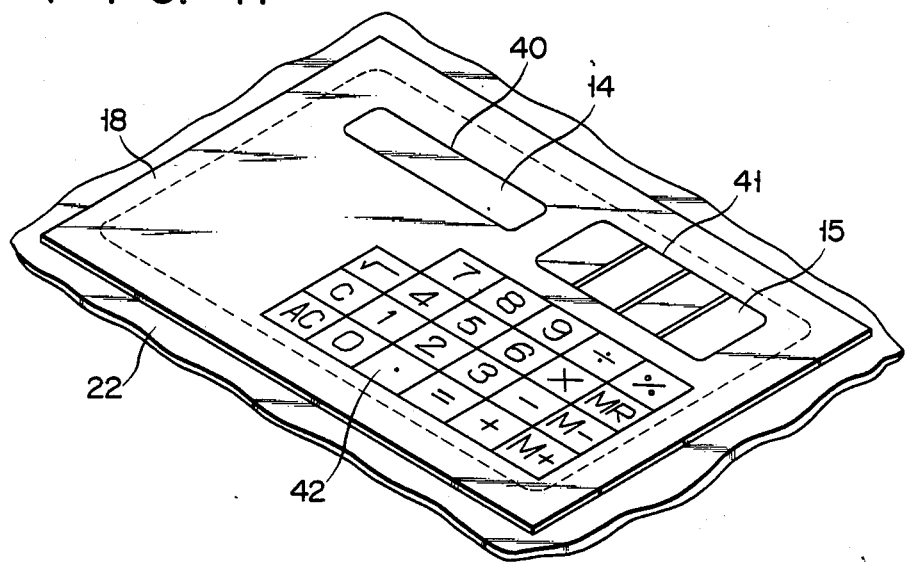
Fig. 11 is a perspective view showing one form of sheet-like miniaturized electronic calculator according to the invention.

At this time, the lower cover 3 is forced down to a position parallel with the upper cover 2, and the total height of the final product is 800 μ. As the lower cover 3 is forced down, the adhesive 22 is forced out from the periphery of the final product. Thus, the lower cover 3 can be forced down to a position corresponding to a preset height. It is thus possible to precisely dispose the upper and lower covers 2 and 3 parallel to each other and to precisely set the distance between them to a designated value. The adhesive 22 flows out freely from between the protective sheets 18 and 21 of the respective upper and lower covers 2 and 3. After the adhesive has been solidified, the protective sheets 18, 21 and the adhesive 22 that are found between these sheets are cut to the final shape along the dashed lines shown in FIG. 10 and 11. The protective sheets 18 and 21 are cut slightly greater than the final size. With the product obtained in the above way, the periphery of the switch contact sheet 16, frame 19 and support sheet 20, all made from stainless steel sheets, are covered by the adhesive 22 found between the protective sheets 18 and 21. The adhesive 22, together with the protective sheets 18 and 21 which are made of resin, provides a feel or resin to the periphery of the sheet-like miniaturized electronic calculator.

Figure 12:
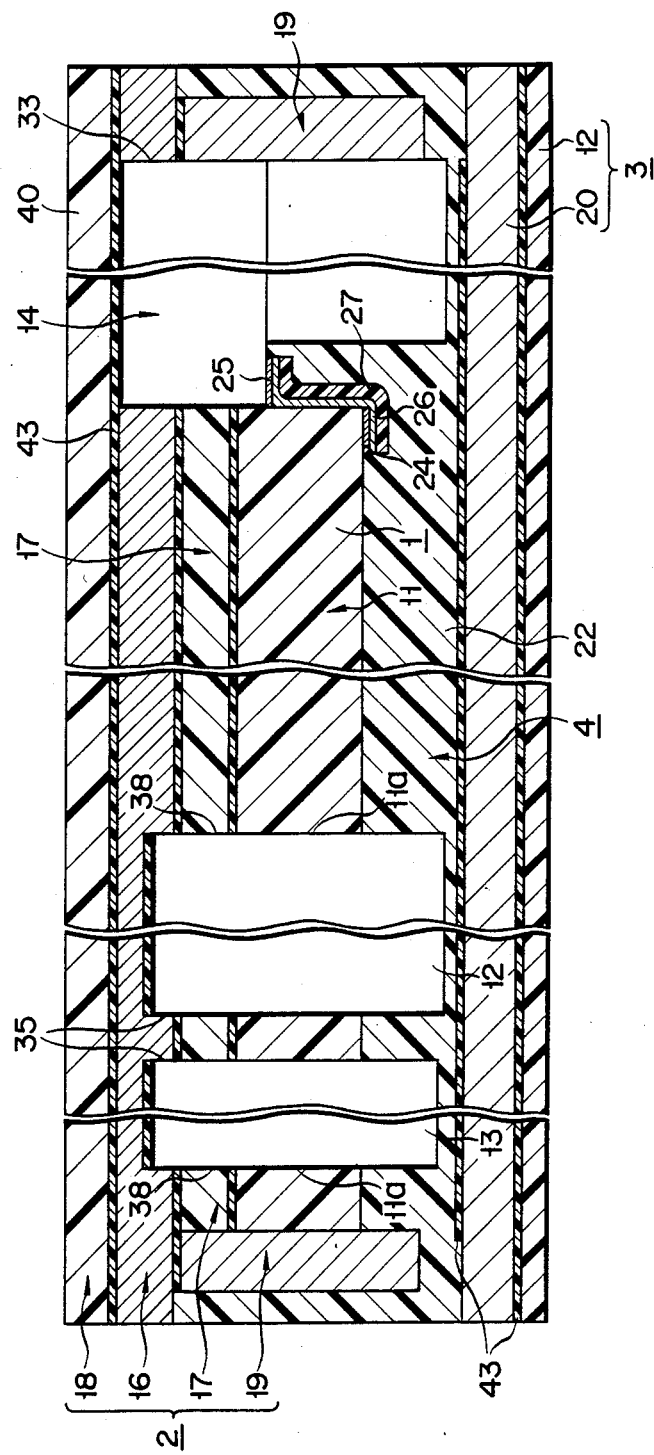
FIGS. 12 to 14 are partly fragmented sectional views showing different embodiments of the invention.
Figure 13:
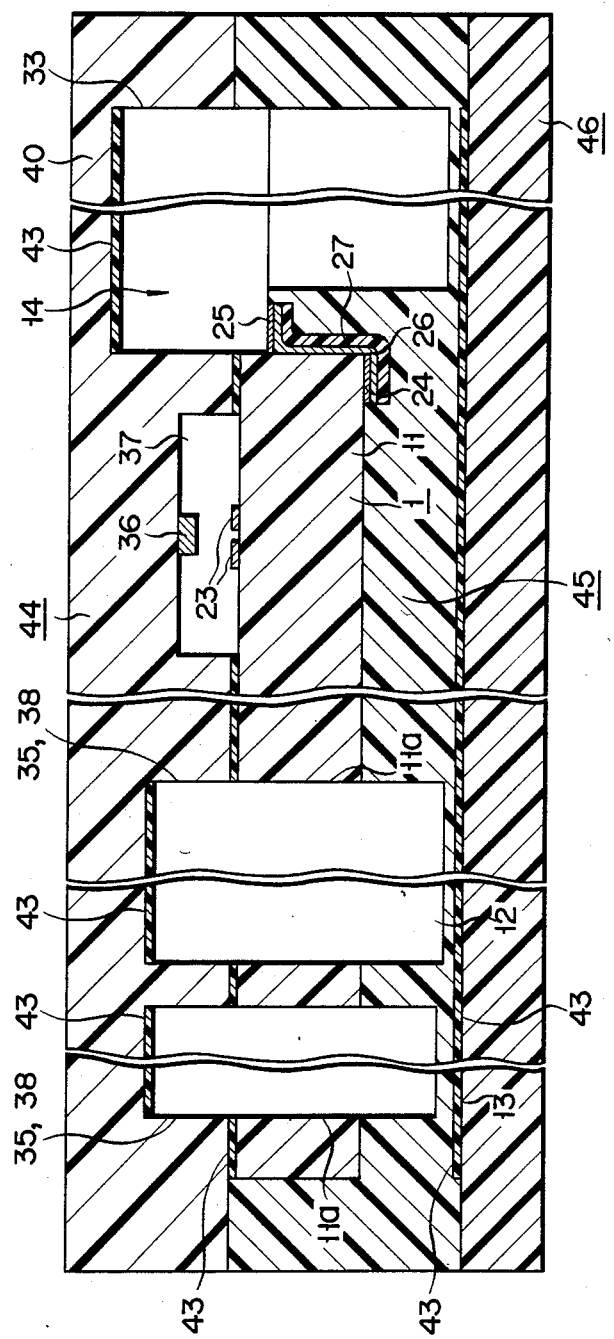
Figure 14:
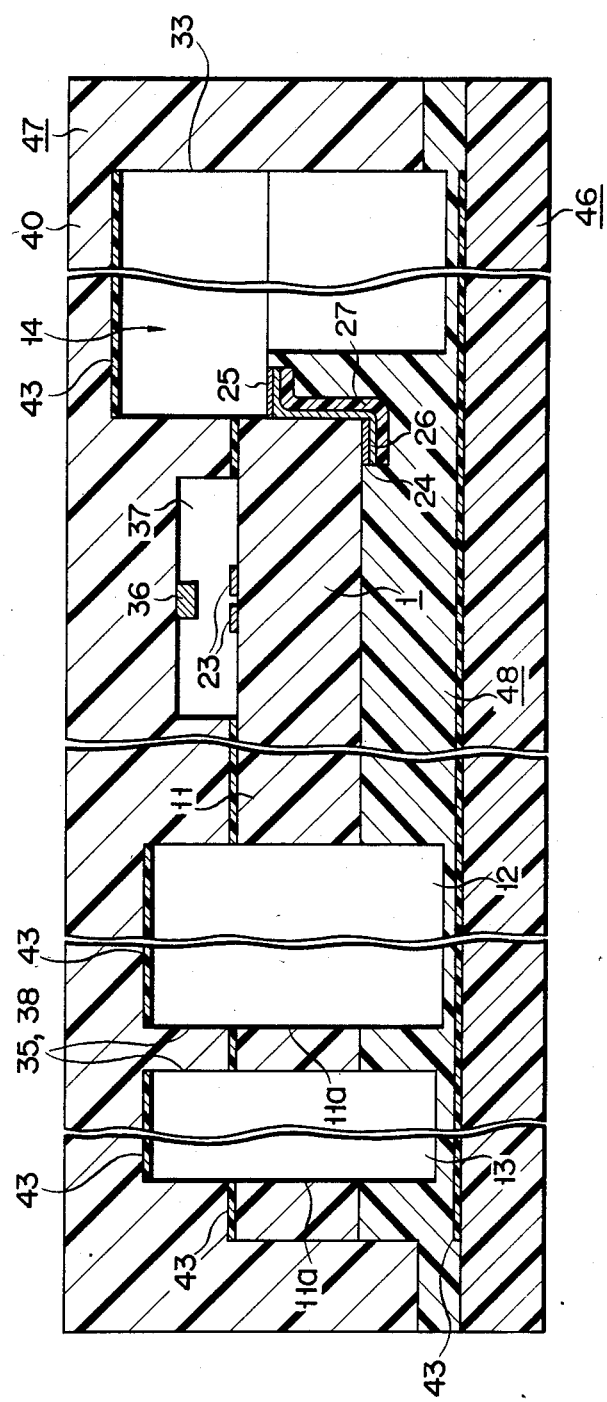

Second to fourth embodiments of the invention will now be described with reference to FIGS. 12 to 14. In these embodiments, as in the preceding first embodiment, the invention is applied to sheet-like miniaturized electronic calculators. In FIGS. 12 to 14 like reference numerals to those in FIGS. 2 and 3 designate like parts.

In the second embodiment of FIG. 12, an adhesive 22 of an adhesive layer 4 is provided between an electronic component assembly 1 and a lower cover 3 and covers the outer four sides of the frame 19 between a switch contact sheet 16 of an upper cover 2, and a support sheet 20 of a lower cover 3. In this instance, the mechanical strength of the edges of the calculator is improved.

The third embodiment of FIG. 13 comprises an upper cover 44 made of hard vinyl chloride or the like which corresponds to the switch contact sheet 16, spacer 17 and upper protective sheet 18 in the first embodiment, and an electronic component assembly 1, an adhesive layer 45 and a lower cover 46 made of hard vinyl chloride which correspond to the support sheet 20 and lower protective sheet 21 in the first embodiment. The upper cover 44 does not have the function of the frame 19 in the first embodiment, but only holds the electronic component assembly 1 in close contact with the upper side thereof. The adhesive layer 45 holds the outer four sides of the electronic component assembly 1 in close contact therewith.

The fourth embodiment of FIG. 14 comprises an upper cover 47 made of hard vinyl chloride or the like, which corresponds to the switch contact sheet 16, spacer 17, upper protective sheet 18 and frame 19 in the first embodiment. A lower cover 46 in this embodiment has the same construction as that in the third embodiment. An adhesive layer 48 is provided between upper cover 47 and electronic component assembly 1.

As has been shown, the upper covers 2, 44, 47 may consist of a lamination of the switch contact sheet 16, spacer 17 and upper protective sheet 18, or may consist of a member which corresponds to some or all of these parts. The frame 19 may be provided as part of the upper cover or as an independent part. The lower covers 3, 46 may consist of a lamination of the support sheet 20 and lower protective sheet 21, or may consist of a single member corresponding to these sheets. The adhesive layers 4, 45, 48 are provided between the electronic component assembly 1 and lower covers 3, 46 and, if necessary, cover the periphery. The constituents of the electronic component assembly 1 are not limited to those described above; for instance, a sheet-like manganese battery may be used instead of the solar battery.

Further, the invention is not limited to sheet-like miniaturized electronic calculators and is applicable to other miniaturized electronic devices such as miniaturized electronic timepieces as well.

What we claim is:

1. A flat miniaturized electronic device comprising:
   a flat and thin insulating sheet with a conductive wiring pattern thereon;
   an electronic component coupled to said conductive wiring pattern, said electronic component having one end surface in the same plane as a first face of said insulating sheet with its opposite end surface projecting from the plane of a second face of said insulating sheet opposite to said first face;
   a first cover mounted opposite to the first face of said insulating sheet and having key indicia thereon;
   switch means between said first cover and the first face of said insulating sheet for actuating an electrical connection to said conductive wiring pattern upon contact of said key indicia by an operator;
   a second cover having a flat outer surface and the same periphery as said first cover and mounted opposite to the second face of said insulating sheet so as to form a gap between the second cover and, respectively, the second face of said insulating sheet and the projecting end surface of said electronic component; and
   an adhesive layer filling said gap.

2. The flat miniaturized electronic device of claim 1, wherein part of said gap is between opposed peripheral surfaces of said first and second covers, with said adhesive layer forming part of the outer periphery of said device.

3. A flat miniaturized electronic device comprising:
an electronic assembly having a first flat face and a second face;
a first cover mounted opposite to the first face of said electronic assembly and having key indicia thereon;
switch means between said first cover and the first face of said electronic assembly for actuating a desired operation by the electronic assembly upon contact of said key indicia by an operator;
a second cover having the same periphery as said first cover and mounted opposite to the second face of said electronic assembly with a gap being formed between opposed peripheral surfaces of the first and second covers; and
adhesive means in said gap for fixing the opposed peripheral surfaces of the first and second covers to each other and to form part of the outer periphery of said device.

4. The flat miniaturized electronic device of claim 3, wherein the adhesive means fixes the second face of said electronic assembly to the second cover.

5. The flat miniaturized electronic device of claim 4, wherein the adhesive means comprises a layer between the electronic assembly and the second cover.

6. The flat miniaturized electronic device of claim 3, wherein the adhesive means fills a void between the electronic assembly and the second cover.

7. A flat miniaturized electronic device comprising:
an electronic component assembly having two faces, and including a thin insulating sheet, a predetermined conductive pattern and an electronic component connected to said pattern;
first cover means being flat, having a face facing said electronic component assembly, and mounted on one of said faces of said electronic component assembly;
a first adhesive layer disposed between said one face of said eletronic component assembly and said assembly-facing face of said first cover means to couple said electronic component assembly and said first cover means together;
second cover means having a flat outer surface, having the same periphery as said first cover means, disposed on the other face of said electronic component assembly, and including a metal sheet having a cavity to accommodate said electronic component; and
a second adhesive layer provided between said other face of said electronic component assembly and an assembly-facing face of said second cover means to couple said electronic component assembly and said second cover means together.

8. The flat miniaturized electronic device of claim 7, wherein said second cover means includes a single resilient plastic sheet having a plurality of key operation sections, and key contacts facing the associated key operation sections, and said electronic component assembly has key contacts positioned so as to make contact, respectively, with said contacts of said first cover means upon manual depression of the plurality of key operation sections.

9. The flat miniaturized electronic device of claim 8, wherein said electronic component assembly includes a display element coupled to said predetermined conductive pattern so as to be in the same plane as said thin insulating sheet.

10. A flat miniaturized electronic device comprising:
first thin plastic sheet means having an even thickness and a predetermined surface area;
a first metal sheet having an even thickness and two faces, one of which is adhered to said first thin plastic sheet means;
an electronic component assembly having a periphery smaller than that of said first metal sheet, a thin insulating sheet, a predetermined conductive pattern and an electronic component connected to said predetermined conductive pattern, said electronic component assembly having two faces one of which is adhered to the other face of said first metal sheet;
a second metal sheet having an even thickness, the same periphery as said first metal sheet, and two faces one of which is adhered to the other face of said electronic component assembly, at least one of said first and second metal sheets having a cavity to receive said electronic component;
second thin plastic sheet means having an outer surface of even thickness and two faces one of which is adhered to the other face of said second metal sheet; and
a frame member disposed between said first and second metal sheets and having a through hole for accommodating said electronic component assembly.

11. The flat miniaturized electronic device of claim 10, wherein said first thin plastic sheet means includes a single resilient plastic sheet having a plurality of key operation sections, and key contacts facing the associated key operation sections, and said electronic component assembly has key contacts positioned so as to make contact, respectively, with said key contacts of said first thin plastic sheet means upon manual depression of the plurality of key operation sections.

12. The flat miniaturized electronic device of claim 11, wherein said electronic component assembly has a display element connected to said predetermined pattern so as to be in the same plane as said thin insulating sheet.

13. A flat miniaturized electronic device comprising:
an electronic component assembly having a thin insulating sheet with a through hole, connecting terminals formed at the periphery of said through hole, a predetermined wiring pattern having one end connected to said connecting terminals, and an electronic component having electrodes connected to said connecting terminals with part of said electronic component being accommodated in said through hole and another part of said electronic component projecting from a surface of said thin insulating sheet;
a flat first cover having a predetermined surface area, an internal surface, and an external surface, said internal surface being adhered to one face of said electronic component assembly;
a second cover having a flat outer surface and the same surface area s said first cover means, an internal surface, and an external surface, said internal surface being adhered to said electronic component assembly;

frame means disposed between said first cover means and said second cover means and having an opening to accommodate said electronic component assembly; and a cavity formed in at least one of said first cover and said second cover accommodating the projecting part of said electronic component.

14. The flat miniaturized electronic device of claim 13, wherein said first cover includes a single resilient plastic sheet having a plurality of key operation sections, and key contacts facing the associated key operation sections, and said electronic component assembly has key contacts positioned so as to be capable of making a contact with said key contacts of said first cover means.

15. The flat miniaturized electronic device of claim 14, wherein said electronic component assembly has a display element connected to said predetermined pattern so as to be in the same plane as said thin insulating sheet.

16. A flat miniaturized electronic device comprising:
a thin insulating sheet having two faces and a through hole;
a plurality of connecting terminals formed at the periphery of said through hole of said thin insulating sheet;
an electronic component hasving electrodes connected to said connecting terminals with said electronic component being disposed in said through hole;
first cover means being flat and having an internal surface connected to one of said two faces of said thin insulating sheet, an external surface, and a single resilient flat sheet having a plurality of key indicia;
second cover means having an internal surface connected to the other face of the two faces of said thin insulating sheet, an external surface, and a metal layer formed at least on that part of said internal surface of said second cover means which faces said electronic component;
a plurality of switching contacts disposed between said thin insulating sheet and said first cover means so as to face said plurality of key indicia;
a predetermined wiring pattern on the thin insulating sheet including a pattern to connect said switching contacts and said connecting terminals;
a display element connected to said predetermined wiring pattern between said first cover means and said second cover means so as to be in the same plane as said thin insulating sheet; and
a thin battery connected to said predetermined wiring pattern between said first cover means and said second cover means so as to be in the same plane as said thin insulating sheet.

* * * * *

UNITED STATES PATENT AND TRADEMARK OFFICE
CERTIFICATE OF CORRECTION

PATENT NO. : 4,680,724

DATED : July 14, 1987

INVENTOR(S) : SUGIYAMA et al

It is certified that error appears in the above-identified patent and that said Letters Patent is hereby corrected as shown below:

Title page, in the listing of "References Cited", list the following references:

USP 4,181,964 - Moore et al
    USP 4,264,962 - Kodaira et al
    USP 4,558,427 - Takeuchi et al Signed and Sealed this Second Day of February, 1988

Attest:

DONALD J. QUIGG

Attesting Officer

Commissioner of Patents and Trademarks